United States Patent
Hui et al.

(10) Patent No.: US 7,259,589 B1
(45) Date of Patent: Aug. 21, 2007

(54) VISUAL OR MULTIMEDIA INTERFACE BUS SWITCH WITH LEVEL-SHIFTED GROUND AND INPUT PROTECTION AGAINST NON-COMPLIANT TRANSMISSION-MINIMIZED DIFFERENTIAL SIGNALING (TMDS) TRANSMITTER

(75) Inventors: Chi-Hung Hui, Saratoga, CA (US); Xianxin Li, Milpitas, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 168 days.

(21) Appl. No.: 11/162,638

(22) Filed: Sep. 16, 2005

(51) Int. Cl.
  *H03K 19/0175* (2006.01)
  *H03K 19/096* (2006.01)
(52) U.S. Cl. .................... 326/63; 326/62; 326/65; 326/81; 326/95; 326/98; 327/333
(58) Field of Classification Search ............... 326/62, 326/63, 81, 95, 98; 327/333
See application file for complete search history.

(56) References Cited

U.S. PATENT DOCUMENTS

| | | | |
|---|---|---|---|
| 4,920,284 A | 4/1990 | Denda | 326/74 |
| 5,321,324 A | 6/1994 | Hardee et al. | 326/62 |
| 5,583,454 A | 12/1996 | Hawkins et al. | 326/81 |
| 5,666,071 A | 9/1997 | Hawkins et al. | 326/86 |
| 5,896,044 A | 4/1999 | Walden | 326/80 |
| 5,933,025 A | 8/1999 | Nance et al. | 326/81 |
| 6,043,699 A | 3/2000 | Shimizu | 327/333 |
| 6,683,473 B2 | 1/2004 | Fotouhi | 326/30 |
| 6,724,224 B1 | 4/2004 | Li | 326/82 |
| 6,724,592 B1 * | 4/2004 | Tong et al. | 361/56 |
| 6,747,503 B2 | 6/2004 | Fotouhi | 327/365 |
| 6,750,686 B2 * | 6/2004 | Wang | 327/115 |
| 6,965,253 B1 * | 11/2005 | Chen et al. | 326/81 |
| 2001/0007430 A1 | 7/2001 | Goodell | 327/308 |
| 2002/0175700 A1 | 11/2002 | Nagano et al. | 326/30 |
| 2004/0158873 A1 | 8/2004 | Pasqualino | 725/131 |
| 2005/0179465 A1 * | 8/2005 | Otsuka et al. | 326/86 |

OTHER PUBLICATIONS

Digital Display Working Group, "Digital Visual Interface DVI", Spec. rev. 1.0, Apr. 2, 1999, pp. 1-6, 33-39.
Hitachi et al., "High-Definition Multimedia Interface Specification Version 1.1", May 20, 2004, pp. 1-9, 31-42.

* cited by examiner

*Primary Examiner*—Rexford Barnie
*Assistant Examiner*—Dylan White
(74) *Attorney, Agent, or Firm*—gPatent LLC; Stuart T. Auvinen

(57) ABSTRACT

A bus switch chip is limited to operating with a power-supply voltage of 1.8 volts relative to a 0-volt ground. Differential bus signals switched through the bus switch chip swing from 2.7 to 3.3 volts, well above the chip's specified power-supply voltage. The bus switch chip is level-shifted by applying a 1.5-volt signal as the chip's ground, and a 3.3-volt signal as its power supply, so the chip's net power supply is within the specification at 1.8 volts. High-Definition Multimedia Interface (HDMI) and Digital Visual Interface (DVI) require that the differential signals are never driven to ground. However, some non-compliant video transmitters drive differential signals to ground when disabled. External pullup resistors or internal pullup transistors in the bus switch chip are added to the bus signals from non-compliant transmitters to pull disabled signals above the 1.5-volt chip ground to prevent damage from signals below the chip's 1.5-volt ground.

21 Claims, 7 Drawing Sheets

VISUAL OR MULTIMEDIA INTERFACE BUS SWITCH WITH LEVEL-SHIFTED GROUND AND INPUT PROTECTION AGAINST NON-COMPLIANT TRANSMISSION-MINIMIZED DIFFERENTIAL SIGNALING (TMDS) TRANSMITTER

FIELD OF THE INVENTION

This invention relates to bus switches, and more particularly to level-shift applications for bus switches.

BACKGROUND OF THE INVENTION

Bus switches are useful for a variety of applications such as telecommunications, personal computer (PC), networking, and graphics. The basic, simple structure of a transistor bus switch is ideal for higher speed applications. Bus switches may have many transistors in parallel that are packaged together in a single integrated circuit (IC) chip package, allowing for parallel signals on a bus to be switched together.

FIG. 1 shows a prior-art bus switch. Bus switch chip 10 multiplexes an A bus and a B bus, that are connected on the left, to a C bus connected on the right. A control or select signal CSEL is input to bus switch chip 10 and is buffered by non-inverting buffer 16 to generate ASEL and inverter 18 to generate BSEL. When ASEL is high, BSEL is low, and bus-switch transistors 12 are turned on and bus-switch transistors 14 are turned off. A-bus signals C0+A, C0−A, C1+A, C1−A, C2+A, C2−A, C3+A, C3−A, applied to the drains of bus-switch transistors 12 are connected to C-bus signals C0+, C0−, C1+, C1−, C2+, C2−, C3+, C3− that are connected to the sources of bus-switch transistors 12. A total of four logical signals are switched, as each logical signal is carried on differential signals designated +, −.

When ASEL is low, BSEL is high, and bus-switch transistors 12 are turned off and bus-switch transistors 14 are turned on. B-bus signals C0+B, C0−B, C1+B, C1−B, C2+B, C2−B, C3+B, C3−B, applied to the drains of bus-switch transistors 14 are connected to C-bus signals C0+, C0−, C1+, C1−, C2+, C2−, C3+, C3− that are connected to the sources of bus-switch transistors 14.

Higher-speed applications can benefit from differential signaling. To signal a logical high, the + signal goes high while the − signal goes low. When the + signal goes low and the − signal goes high, a logical low is signaled. Since the difference in the +, − signal lines is detected, only a small voltage difference is needed to overcome noise that is common to both +, − signal lines. Thus differential signaling often used reduced voltage swings or small signals. For example, when a 3.3-volt power supply is used, differential signals may switch from 2.7 volts to 3.3 volts. The voltage swing is limited to 0.6 volts, rather than the full 3.3 volts. This reduced voltage swing reduces the amount of charge that must be moved to charge and discharge capacitances, reducing the switching delays.

Several standards for differential signaling with small signals are known. Transmission-minimized differential signaling (TMDS) is one such standard that is used for video applications such as Digital Visual Interface (DVI) and High-Definition Multimedia Interface (HDMI). TMDS limits voltage swings to 2.7-3.3 volts.

FIGS. 2A-B show reduced-voltage-swing communication using a TMDS transmitter and receiver. In FIG. 2A, TMDS transmitter 30 uses switches 32 to switch current from current source 34 between the two complementary differential signal lines of differential lines 28. TMDS receiver 20 has comparator 22 that compares the voltages on differential lines 28 to determine the state of logical data D that was transmitted from TMDS transmitter 30. Pullup resistors 24 to a 3.3-volt Vcc power supply bias differential lines 28.

Differential lines 28 may be carried through cable 26 between TMDS transmitter 30 and TMDS receiver 20. Cable 26 may contain one or more ground wires or sheaths that connect the grounds in TMDS transmitter 30 and TMDS receiver 20. When TMDS transmitter 30 and TMDS receiver 20 operate using a Vcc power supply of 3.3 volts or above, the voltage swing on differential lines 28 can be limited to the range of 2.7 to 3.3 volts, as shown in FIG. 2B.

Higher data rates have required the use of better process technologies for bus switch chip 10. As the physical sizes of bus-switch transistors 12, 14 are shrunk, breakdown voltages also decrease. Thus the voltages applied to bus-switch transistors 12, 14 must be scaled downward as speeds increase. Power-supply voltages of 5 volts have been reduced to 3.3 volts and now to 2.0 or 1.8 volts. Very high-speed applications such as for 1.65 Giga bits per second (Gbps) benefit from the lower capacitances of transistors made with advanced process technologies that typically use 2.0-volt and below power supply voltages.

Although the gate voltages may sometimes be increased above the power supply voltage using a charge pump, the source and drain voltages on bus-switch transistors 12, 14 should remain below the power-supply voltage, or no more than 0.3 volt above the power-supply voltage or 0.3 volt below ground to prevent damage or latch up.

Differential signaling standards such as TMDS were designed for higher power-supply voltages such as 3.3 volts and above. Since the voltage swing of 2.7-3.3 volts is greater than a 2.0-volt power supply, operating bus switch chip 10 with a 2.0-volt power supply would not allow TMDS signals to pass through, as voltages above the 2.0-volt power supply would be clipped. Thus simply using a 2.0-volt Vcc with bus switch chip 10 does not appear to be useful for switching TMDS signals that operates at 2.7-3.3 volts. However, bus switch chip 10 designed for 3.3-volt power supplies may have too much capacitance due to the larger transistor sizes needed to protect against breakdown and damage from the higher voltages.

Newer differential signaling standards have reduced ranges of voltage swings. These newer standards such as low-voltage differential signaling (LVDS) are useful with reduced power supplies, since the differential voltage swing is well below the power supply voltage. Unfortunately, some standards do not use LVDS, but instead use TMDS, perhaps to allow use with legacy devices such as older DVD and video cards. These TMDS applications are still important, even though the TMDS voltage swings are designed for use with higher power supply voltages that were used with legacy video cards.

What is desired is to use a low-capacitance bus switch chip designed for 2.0-volt power supplies for switching TMDS signals that have voltage swings from 2.7-3.3 volts.

DETAILED DESCRIPTION

The present invention relates to an improvement in bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a bus switch chip designed for a reduced 2.0-volt power supply may be used for switching elevated TMDS voltage swings by shifting upward both the ground and power supply voltage applied to the bus switch chip. Rather than apply a 2.0 or 1.8 volt power supply and a 0-volt ground to bus switch chip 10, 1.5 volts is applied to the ground pin of bus switch chip 10. The Vdd power supply pin of bus switch chip 10 receives 3.3 volts, which is roughly 1.5+1.8 volts. The differences between the 3.3-volt Vdd and the 1.5-volt ground is 1.8 volts. Thus the net supply-voltage difference of 1.8 volts falls within the design limits of bus switch chip 10 produced on a 2.0-volt semiconductor process.

Figure 3A:
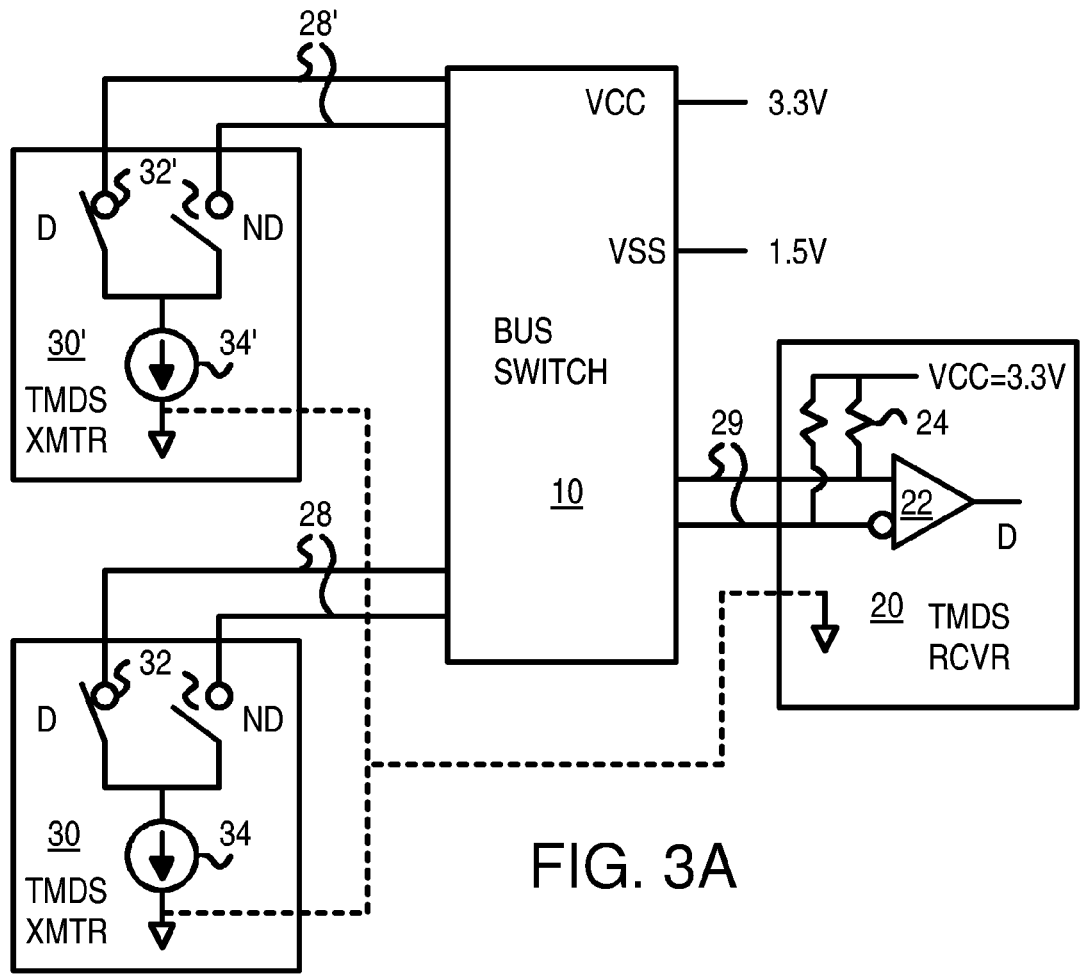
FIG. 3A shows a level-shifted bus switch chip that switches elevated-voltage-swing TMDS signals.
Figure 3B:
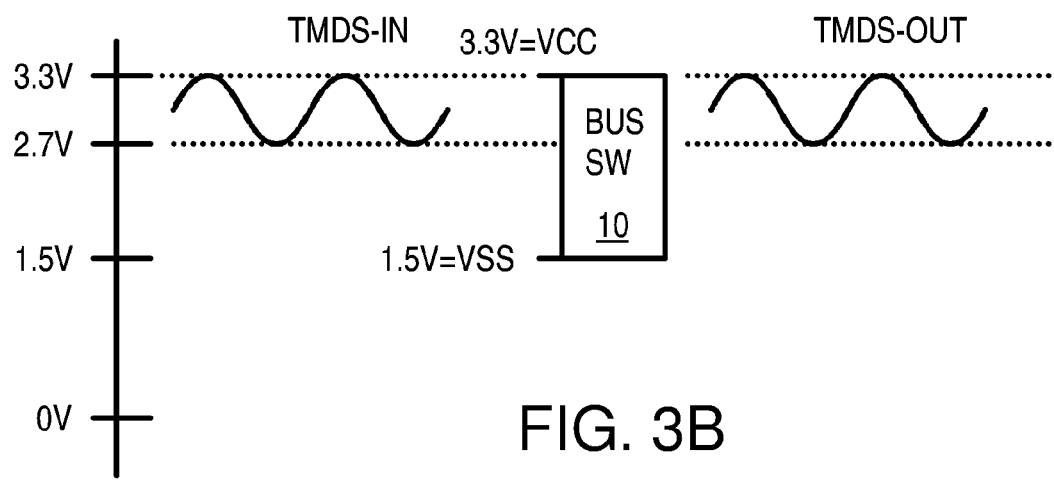
FIG. 3B is a voltage graph of voltages applied to bus switch chip 10.

FIGS. 3A-B show a level-shifted bus switch chip that switches elevated-voltage-swing TMDS signals. Bus switch chip 10 switches either differential lines 28 from first TMDS transmitter 30 or differential lines 28' from second TMDS transmitter 30' to differential lines 29 to TMDS receiver 20.

The grounds of first TMDS transmitter 30, second TMDS transmitter 30', and TMDS receiver 20 are connected together. Cables carrying differential lines 28, 28', 29 may carry this common ground; however, this 0-volt ground is not connected to bus switch chip 10.

Instead, bus switch chip 10 receives a 1.5-volt signal as its ground. The Vss "ground" pin of bus switch chip 10 is driven by a 1.5-volt regulated power supply. Thus the internal ground of bus switch chip 10 is at 1.5 volts, which is 1.5 volts above the true 0-volt ground of first TMDS transmitter 30, second TMDS transmitter 30', and TMDS receiver 20 that generate and compare the TMDS signals.

The Vdd power supply pin of bus switch chip 10 is connected to a 3.3-volt power supply. Normally, applying a 3.3-volt signal to the Vdd pin of bus switch chip 10 would violate the chip's specifications, since Vdd is limited to 2.0 volts or below. However, since the Vss ground pin is biased to 1.5 volt, the net voltage difference between Vdd and Vss pins is 3.3−1.5=1.8 volts, which meets the specifications of bus switch chip 10.

Figure 1:
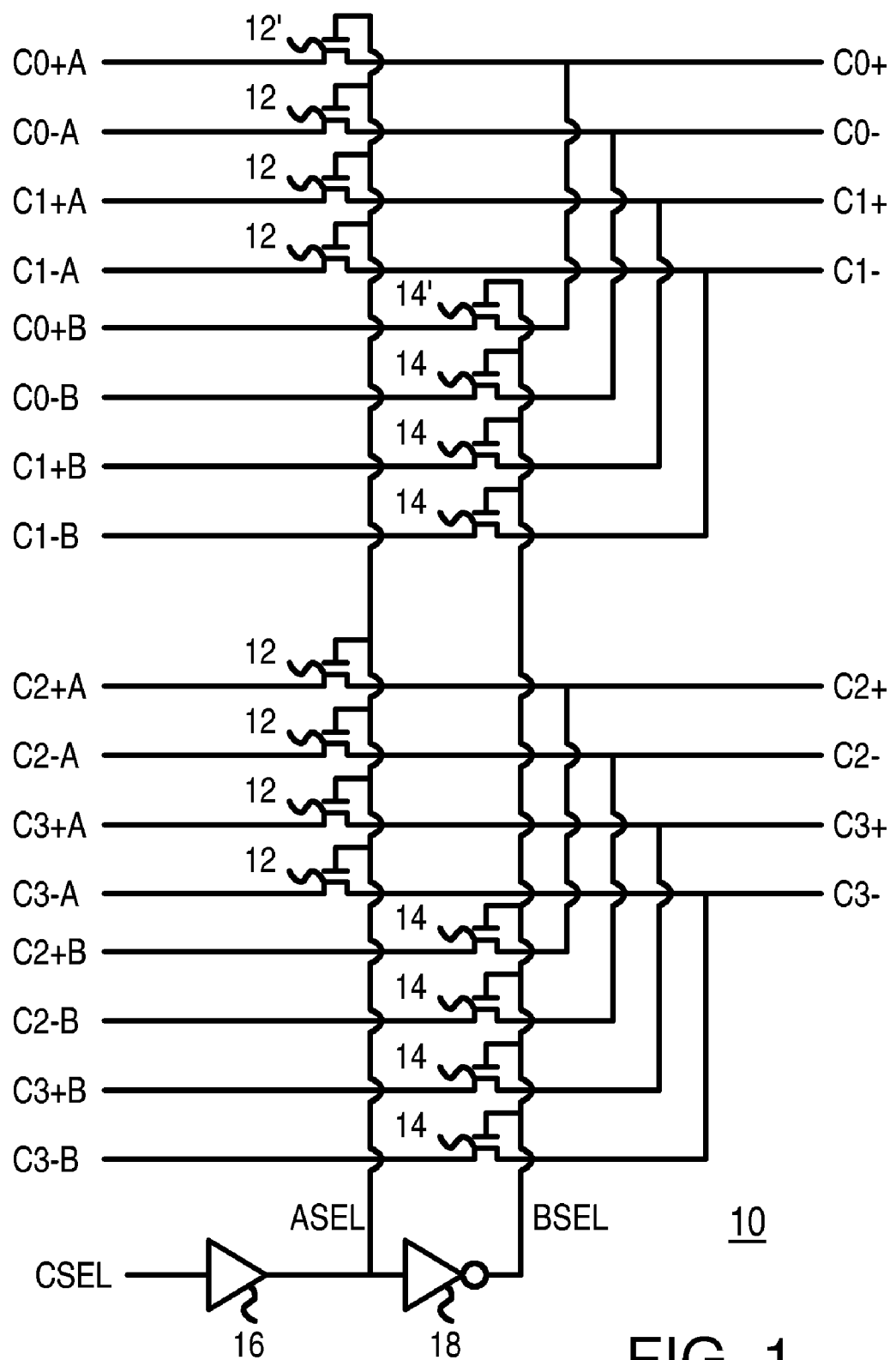
FIG. 1 shows a prior-art bus switch.
Figure 2A:
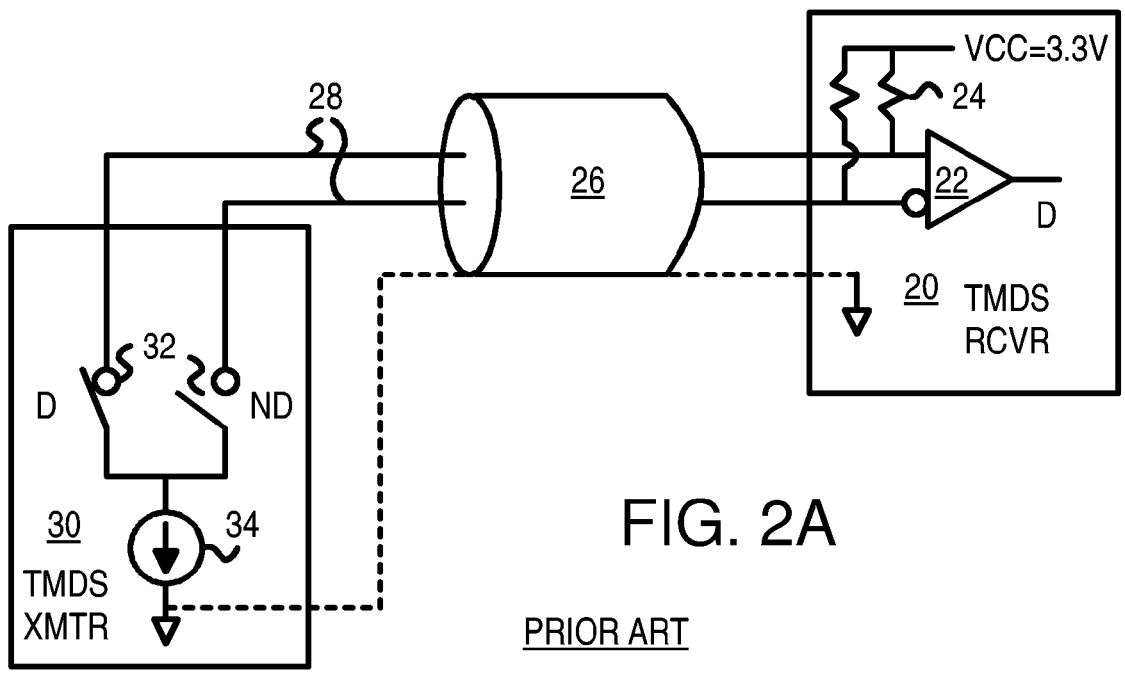
FIGS. 2A-B show reduced-voltage-swing communication using a TMDS transmitter and receiver.
Figure 2B:
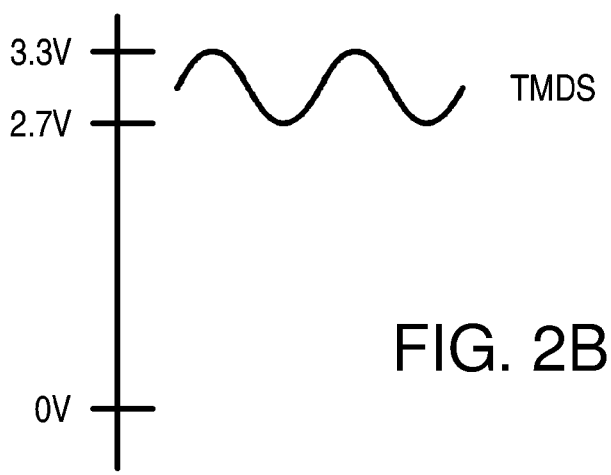

FIG. 3B is a voltage graph of voltages applied to bus switch chip 10. First and second TMDS transmitters 30, 30' generate TMDS signals that swing between 2.7 and 3.3 volts as shown on the left in FIG. 3B. These 2.7-to-3.3 volt signals are applied to the inputs of bus switch chip 10 as buses A and B (FIG. 1).

Bus switch chip 10 has Vdd connected to 3.3 volts, and Vss connected to 1.5 volts. Thus the voltage range of bus switch chip 10 is 1.5 to 3.3 volts, as shown in the middle of FIG. 3B. Since TMDS signals switch within the range of bus switch chip 10, the TMDS signals of 2.7 to 3.3 volts are successfully passed through bus switch chip 10. Bus switch chip 10 drives differential lines 29 to TMDS receiver 20 with TMDS-OUT signals that also swing from 2.7 to 3.3 volts as shown in the right of FIG. 3B.

The internal ground of bus switch chip 10 is at 1.5 volts, well above the ground of first TMDS transmitter 30, second TMDS transmitter 30', and TMDS receiver 20. The HMDI and DVI specifications require that any TMDS transmitter always drive its differential signals with voltages between 2.7 and 3.3 volts. When a TMDS transmitter is disabled, the specifications require that TMDS transmitters do not drive their differential lines. Instead, the TMDS transmitters are required to tri-state or place these outputs in a high-impedance state. Thus the specifications prohibit TMDS transmitters from driving any voltage outside the range of 2.7 to 3.3 volts. A TMDS transmitter is thus prohibited from driving 0 volts onto differential lines 28.

Most TMDS transmitters follow the specifications and place their outputs in a high-impedance state. The differential lines can float as they are not actively driven.

However, the inventors have discovered that some TMDS transmitters violate the specifications. These non-compliant TMDS transmitters actively drive a 0-volt ground onto differential lines 28.

Figure 3C:
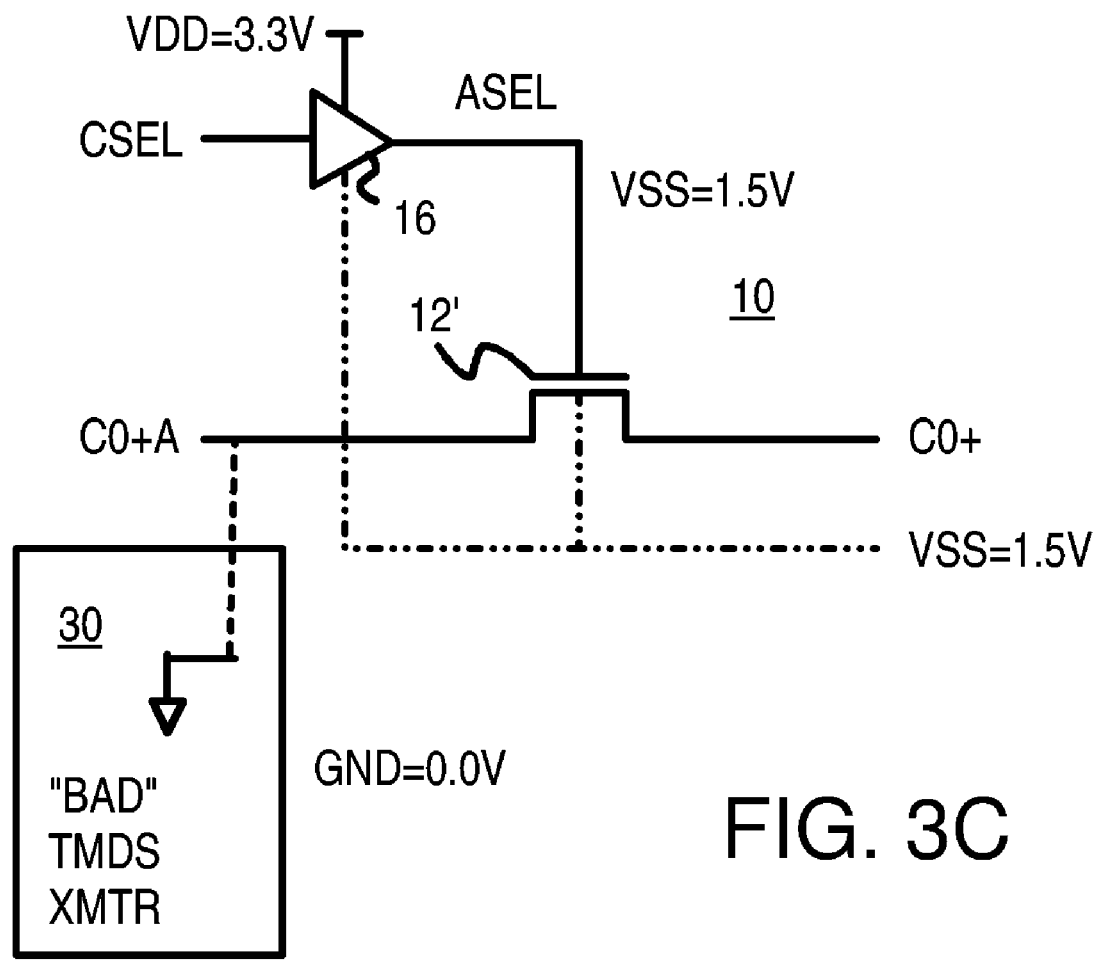
FIG. 3C shows a non-compliant TMDS transmitter causing a failure on bus switch chip.

FIG. 3C shows a non-compliant TMDS transmitter causing a failure on bus switch chip. When non-compliant TMDS transmitter 30 is disabled, it should place its outputs in a high-impedance state. Instead, and in violation of the specification, non-compliant TMDS transmitter 30 grounds its output to bus switch chip 10. When this grounded output from non-compliant TMDS transmitter 30 drives the C0+A input to bus switch chip 10 as shown, bus-switch transistor 12' has its source connected to the 0-volt ground. The substrate under bus-switch transistor 12' is connected to the internal ground of bus switch chip 10, Vss, which is connected to the 1.5-volt regulated power supply. Since the substrate under a n-channel transistor is p-type, and the source is n+ type, the n+ to p-substrate diode junction is forward biased. Negative current can flow from the C0+A input to the substrate.

The gate of bus-switch transistor 12' is driven by signal ASEL from buffer 16. Buffer 16 is powered by a Vdd of 3.3 volts and an internal Vss ground of 1.5 volts. When ASEL is low, ASEL is driven to 1.5 volts. Thus the gate of bus-switch transistor 12' is at 1.5 volts when turned off.

The gate-to-source voltage of bus-switch transistor 12' is 1.5−0=1.5 volts, which is above the transistor threshold voltage of about 0.7 volts. Thus bus-switch transistor 12' turns on, connecting its source and drain. Current can flow through bus-switch transistor 12'. Even though ASEL is logically low at the internal Vss, bus-switch transistor 12' fails to isolate bus signal C0+A from C0+. Bus switch chip 10 has failed.

The inventors have observed these kinds of failures when TMDS transmitters are on some legacy digital-versatile disk (DVD) and digital-video-interface cards. Although these legacy cards do not follow the DVI specification, consumers may still have these cards. Failures may occur.

Figure 4:
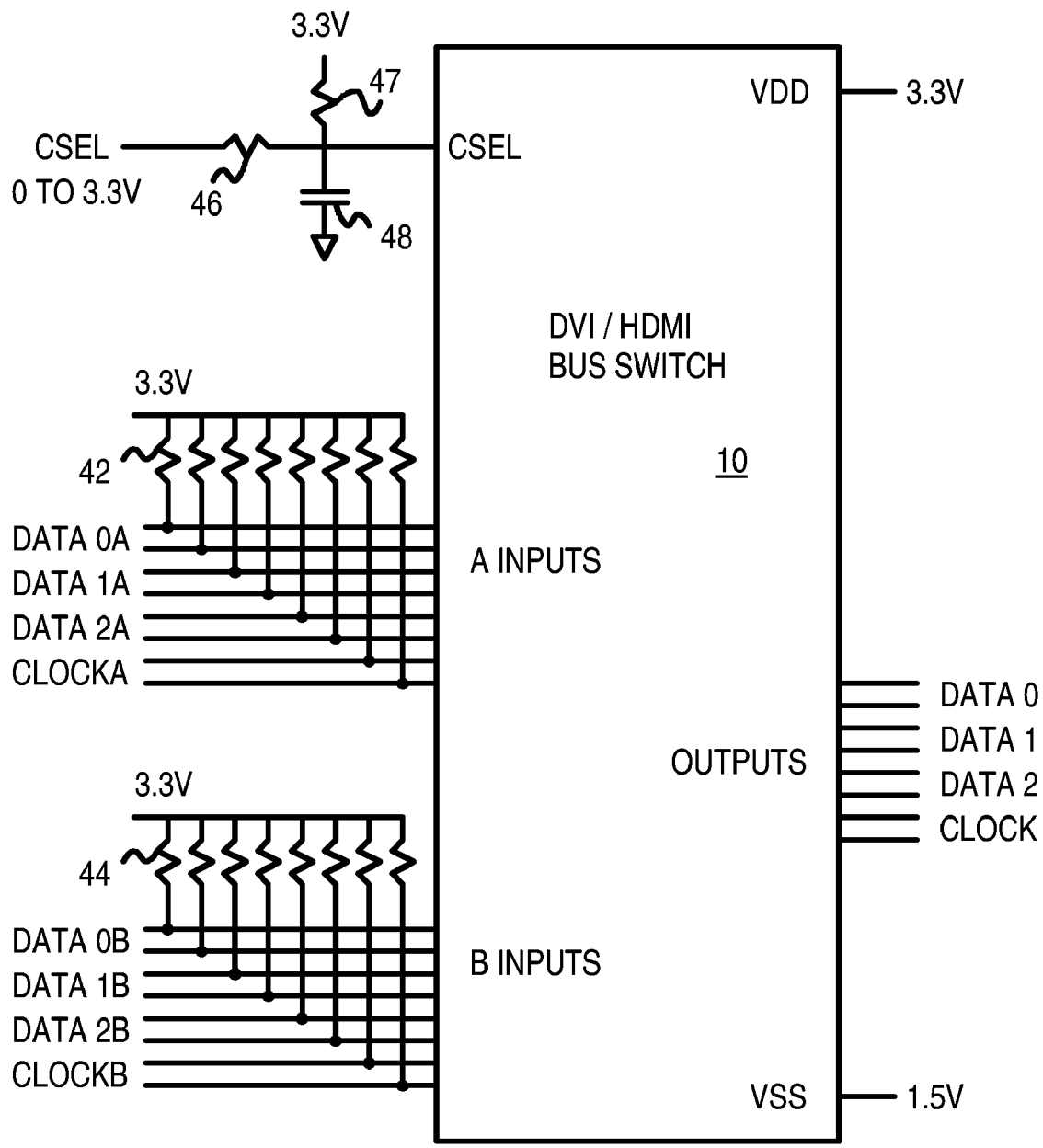
FIG. 4 shows a board-level TMDS solution that uses pullup resistors external to a level-shifting bus switch chip.

The inventors have discovered this problem and have also devised solutions. FIG. 4 shows a board-level TMDS solution that uses pullup resistors external to a level-shifting bus switch chip.

Bus switch chip 10 of FIG. 1 operates as a DVI/HDMI bus switch, receiving TMDS signals that switch between 2.7 and 3.3 volts on A-bus inputs and B-bus inputs. Bus switch chip 10 drives TMDS signals onto outputs that also swing from 2.7 to 3.3 volts.

Bus switch chip 10 has a Vdd power supply pin that is driven by a 3.3-volt power supply, and a Vss ground pin that is driven by a 1.5-volt regulated signal rather than the board ground of 0 volts. Bus switch chip 10 can be designed for a 1.8 or 2.0-volt power supply since the difference between Vdd and Vss pins meets this specification.

The differential bus signals include 3 logical data signals DATA0:3 and a clock signal CLOCK, that each have + and − differential signal wires that carry TMDS signals. Pullup resistors 42 are added to each differential wire for the A-bus inputs, while pullup resistors 44 are added to each differential wire for the B-bus inputs. Resistors 42, 44 are connected to the 3.3-volt ground.

When a non-compliant TMDS driver is disabled and illegally drives one or more DATA and CLOCK lines to the 0-volt ground, resistors 42, 44 supply current to those grounded lines to raise their voltages. The values of resistors 42, 44 can be chosen so that the voltages are pulled above the 1.5-volt internal Vss ground of bus switch chip 10. Even if the inputs were pulled to 0.3 volts below the 1.5-volt ground (to 1.2 volts), the specification of bus switch chip 10 is met and bus-switch isolation is secured. For example, resistors 42, 44 can be 200-ohm resistors and can be part of a resistor pack mounted onto a printed-circuit board (PCB) that bus switch chip 10 is also mounted onto.

The select input, CSEL, may be generated by a 3.3-volt device that drives from a high of 3.3-volt to a low of 0-volts. Series resistor 46 and pullup resistor 47 act as a voltage divider to ensure that the voltage between resistors 46, 47 is between 1.5 and 3.3 volts. Capacitor 48 filers the CSEL input voltage to bus switch chip 10. Although various values may be used, series resistor 46 may be a 1.5 K-Ohm resistor while pullup resistor 47 is a 1.8 K-Ohm resistor. Capacitor 48 may be a 0.001 micro-Farad capacitor.

Figure 5:
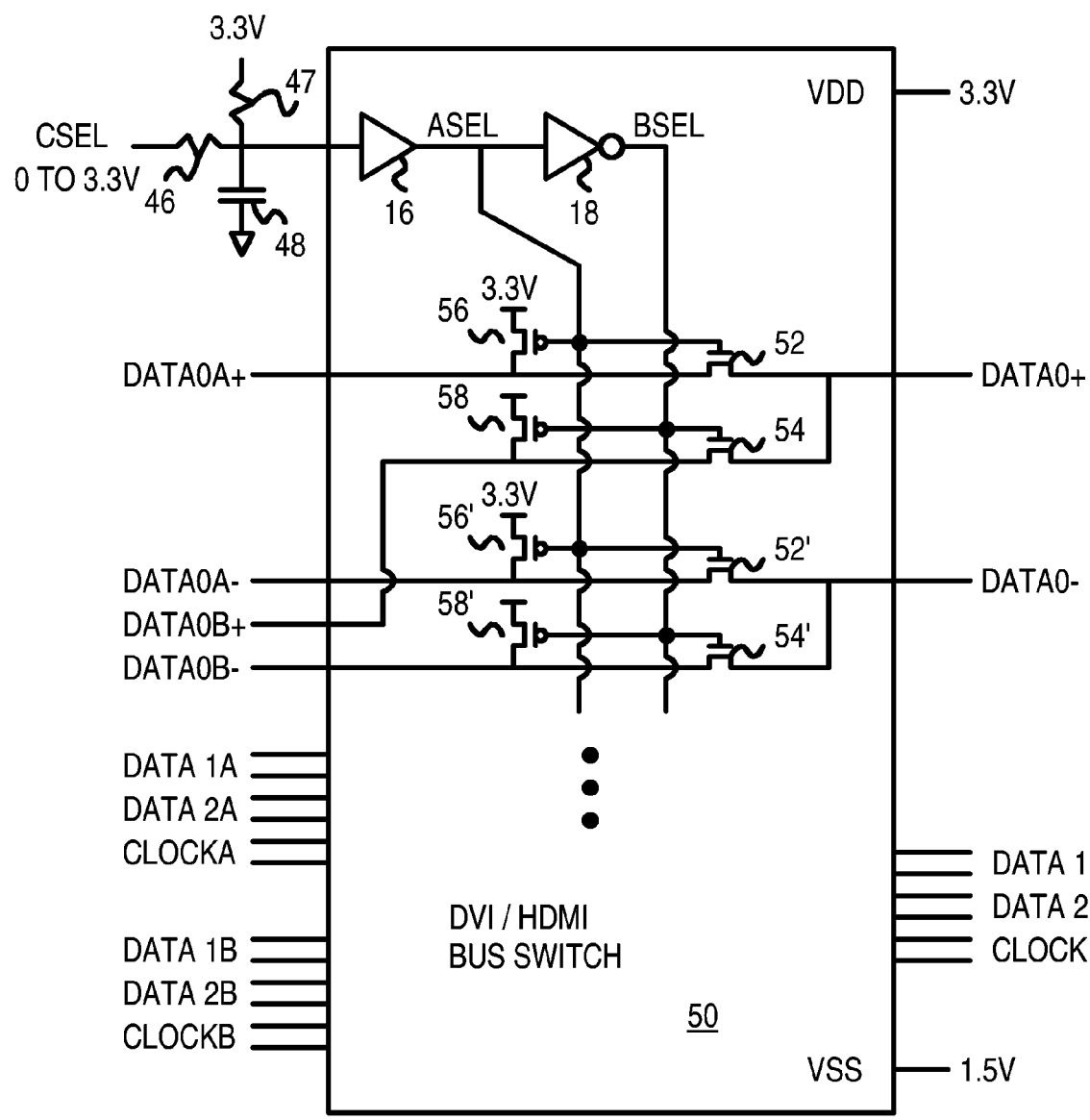
FIG. 5 shows a TMDS solution that uses transistor pullups integrated within a level-shifting bus switch chip.

FIG. 5 shows a TMDS solution that uses transistor pullups integrated within a level-shifting bus switch chip. Bus switch chip 50 is similar to bus switch chip 10 of FIG. 1 but has additional pullup transistors 56, 58 integrated within the chip.

Bus switch chip 50 operates as a DVI/HDMI bus switch, receiving TMDS signals that switch between 2.7 and 3.3 volts on A-bus inputs and B-bus inputs. Bus switch chip 50 drives TMDS signals onto outputs that also swing from 2.7 to 3.3 volts.

Bus switch chip 50 is level-shifted, having a Vdd power supply pin that is driven by a 3.3-volt power supply, and a Vss ground pin that is driven by a 1.5-volt regulated signal rather than the board ground of 0 volts. Bus switch chip 50 can be designed for a 1.8 or 2.0-volt power supply since the difference between Vdd and Vss pins meets this specification.

The select input, CSEL, has a high of 3.3-volt and a low of 0-volts. Series resistor 46 and pullup resistor 47 act as a voltage divider to ensure that the voltage between resistors 46, 47 is between 1.5 and 3.3 volts. Capacitor 48 filers the CSEL input voltage to bus switch chip 50. Buffer 16 generates ASEL high (3.3 volts) when bus A is connected to bus C, and low (1.5 volts) when bus A is isolated and bus B is connected. Inverter 18 generates BSEL high (3.3 volts) when bus B is connected to bus C, and low (1.5 volts) when bus B is isolated and bus A is connected. BSEL and ASEL are in opposite states.

When ASEL is high, bus-switch transistor 52 turns on, connecting DATA0A+ to DATA0+ and p-channel pullup transistor 56 turns off. Also, bus-switch transistor 52' turns on, connecting DATA0A− to DATA0− and p-channel pullup transistor 56' turns off. Other bus-switch transistors (not shown) connect other data and clock signals of bus A to outputs while other p-channel pullup transistors remain off for bus A. Inverter 18 drives BSEL low, causing bus-switch transistors 54, 54' to remain off while p-channel pullup transistors 58, 58' turn on to pullup any illegal grounded inputs from non-compliant TMDS transmitters on bus B.

When ASEL is low, bus-switch transistor 52 turns off, disconnecting DATA0A+ from DATA0+, and bus-switch transistor 52' turns off, disconnecting DATA0A− from DATA0−. P-channel pullup transistors 56, 56' turn on. Other bus-switch transistors (not shown) disconnect and isolate other data and clock signals of bus A from outputs while other p-channel pullup transistors turn on to drive bus A above 1.5 volts despite any illegal grounded inputs from non-compliant TMDS transmitters on bus A.

Inverter 18 drives BSEL high, causing bus-switch transistors 54, 54' to turn on while p-channel pullup transistors 58, 58' turn off. Bus-switch transistor 54 connects DATA0B+ to DATA0+, and bus-switch transistor 54' connects DATA0B− to DATA0−.

P-channel pullup transistors 56, 56', 58, 58' act as active pull-ups that are turned on when the bus input is disconnected. The size or channel ON current from p-channel pullup transistors 56, 56', 58, 58' can be designed to approximate the current from an 80 to 120 Ohm resistor. The values of transistors 56, 56', 58, 58' are chosen so that the bus-input voltages are pulled above the 1.5-volt internal Vss ground of bus switch chip 50. Even if the inputs were pulled to 0.3 volts below the 1.5-volt ground (to 1.2 volts), the specification of bus switch chip 50 is met and bus-switch isolation is secured.

The inventors estimates that TMDS drivers that drive 12 mA have an output impedance of about 225 Ohms for a 0.6 volt swing.

Figure 6:
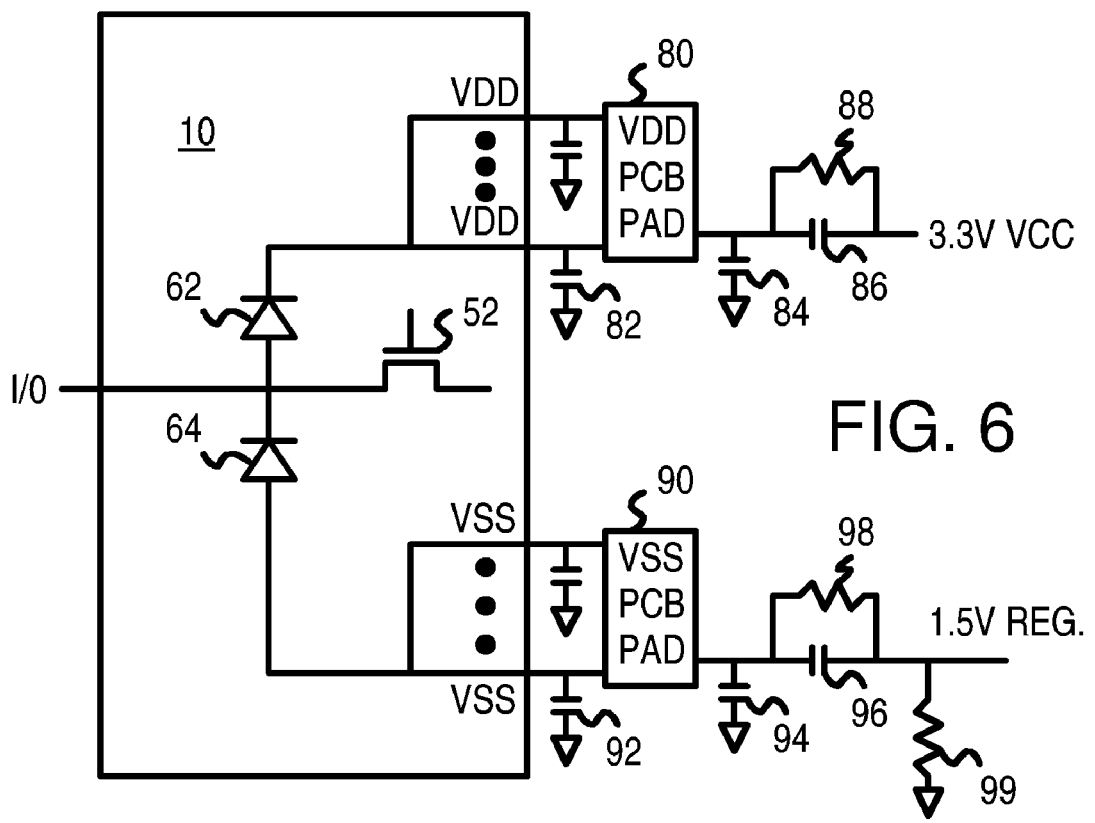
FIG. 6 is an input protection circuit for electro-static-discharges (ESD) using external resistors.

FIG. 6 is an input protection circuit for electro-static-discharges (ESD) using external resistors. DVI and HDMI connectors may support hot plugging. Electrical-Over-Stress (EOS) damage may result.

Diodes 62, 64 are located on each I/O pin of bus switch chip 10 as part of the input-protection or ESD-protection structures integrated within bus switch chip 10. Diodes 62, 64 protect bus-switch transistor 52 by drawing away high current from an ESD event to Vdd or Vss pins of bus switch chip 10.

There may be multiple Vdd and Vss pins on bus switch chip 10. Bypass capacitors 82, 92 stabilize the power and ground supplies at the chip pins, between the chip package and pads 80, 90 formed from metal on the PCB. Additional bypass capacitors 84, 94 can have larger capacitance values.

Series capacitor 86 and series resistor 88 are connected between Vdd pad 80 and the 3.3 volt power supply on the circuit board. Likewise, series capacitor 96 and series resistor 98 are connected between Vss pad 90 and the 1.5 volt regulated power supply on the circuit board. Resistor 99 between the 1.5-volt regulator and the 0-volt ground can be a 120-Ohm resistor to pre-load the current from the 1.5-volt Vss regulator to compensate the Icc from Vss, since the 1.5V regulator can supply current from the regulator to the load, but cannot absorb the current from the Vss pin.

Series resistors 88, 98 can be 20 to 40 Ohms.

When the DVI/HDMI bus switch is in normal working condition with active input and output signals, the maximum Icc supply current is less than 2 mA as a real measured typical value. Thus, the maximum voltage drop on a maximum-valued 40-ohm resistor 88, 98 is 0.002 A×40=0.08V, which does not degrade the performance of the switch.

But when there is a +/−15V EOS voltage applied to the signal IO pins of bus switch chip 10, resistors 88, 98 limit the current to 15V/40 Ohms=350 mA, which should not damage bus switch chip 10 since ESD diodes 62, 64 between the 10 pins and Vdd and Vss can typically tolerate more than 500 mA forward current without damage.

Figure 7:
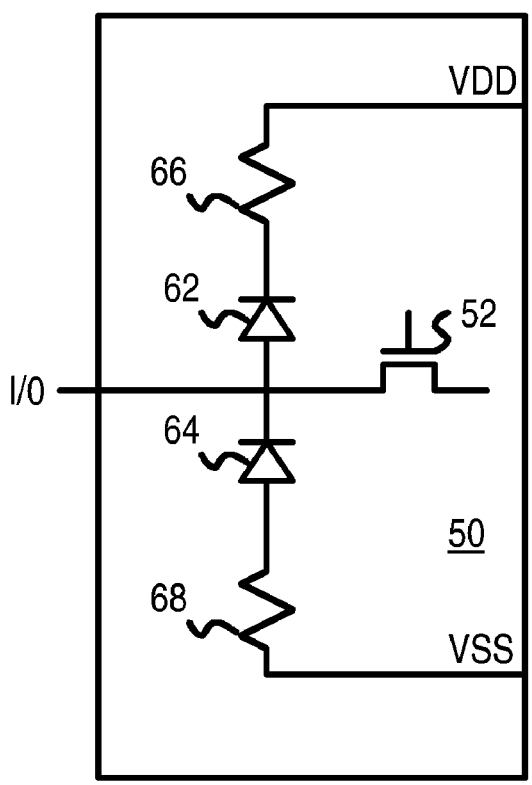
FIG. 7 is an input protection circuit for ESD using internal resistors.

FIG. 7 is an input protection circuit for electro-static-discharges (ESD) using internal resistors. Series resistors 66, 68 can be integrated on bus switch chip 50 in series with diodes 62, 64. Additional, integrated ESD protection results.

ALTERNATE EMBODIMENTS

Several other embodiments are contemplated by the inventors. For example the bus switch chip may have multiple Vdd power supply pins and multiple Vss ground pins that may be connected together internally and externally on the board. Internal gates could be added to drive both ASEL and BSEL low to isolate all buses in response to a disable signal. Various other modes could be supported with additional logic.

Circuits may be implemented in a variety of ways, arrangements, and devices. Super-Vdd voltages above the applied power supply voltage, and power-supply voltages other than 1.8 volts could be used in some embodiments. These voltages may be nominal or target values that may vary somewhat, such as due to power-supply fluctuations or load factors.

Many bus switches may be integrated and packaged together in an integrated circuit package. For example, a bus-switch chip may contain 8 or 16 or some other number of bus-switch transistors in parallel. These may share a gate control signal, which is buffered on the chip. A chip-select signal may be used for bus-switch control, or other signals may be used, such as address bits, bus control signals generated by the memory controller or by other logic, or bank or module select signals. One chip-select or bus-switch control signal could be an inverse of the other select or control signal and could be generated from the other select or control signal.

Signals may have a voltage swing that is further reduced from the 2.7 to 3.3 volt swing described. For example, some signals may vary only a few tenths of a volt from high to low levels. The terms Vcc or Vdd are commonly used to refer to power supply voltages and do not imply particular technologies such as bipolar collectors or MOS drains. Standards other than TMDS, DVI, and HDMI may benefit from the invention. For example, an advanced process may require a power supply of 1.2 volts, while differential signals swing from 1.5 to 1.8 volts. Other combinations of power supply voltages and differential swings may be used.

Noise and glitches may occasionally drive voltages outside of nominal ranges. For example, differential signals that swing from 2.7 to 3.3 volts may occasionally rise to 3.5 volts due to a glitch yet the differential signal is considered to be within the 2.7 to 3.3 volt range since the glitch is an abnormal event.

Rather than apply Vss to the bus-switch transistor gate during isolation, other voltages may be applied such as a voltage below Vss applied to a source or drain of the bus-switch transistor. Circuitry may be added that normally applies Vss to the gate during isolation, but may sense voltage dips below Vss on the source or drain and connect the sub-ground drain/source voltage to the gate during the voltage dip.

The terms source and drain may be interchangeable, depending on the relative voltages on each node. More than two bus switches could be placed on a bus segment, allowing three or more branch bus segments. Additional bus segments could exist, and more complex bus architectures could be used.

Signals may be uni-directional or bi-directional. Some signals such as address signals may be generated by one controller and received by another device, while other signals such as reply signals may be generated by the device and received by the controller. Other signals such as data may change direction, such as for read and write operations.

The OFF capacitance of a bus-switch device is mostly the source or drain capacitance, while the ON capacitance includes both source and drain capacitances, and the gate capacitance since a conducting channel is formed under the transistor gate. The gate capacitance is often the largest component. Other parasitic capacitances are also present.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential signaling system comprising:
   a bus switch chip having a plurality of channels that connect a first bus to a second bus in response to a control signal being in a connect state, and that isolate the first bus from the second bus in response to the control signal being in an isolate state, the bus switch chip having a power-supply pin and a ground pin;
   a first differential transmitter that generates differential signals applied to the bus switch chip as the first bus;
   a differential receiver, coupled to the second bus from the bus switch chip, the differential receiver receiving differential signals passed through the bus switch chip from the first differential transmitter when the control signal is in the connect state;

a ground supply having a ground voltage;

a power supply having a power supply voltage above the ground voltage;

a mid-level supply, having a mid voltage between the power supply voltage and the ground voltage;

wherein the power supply voltage from the power supply is applied to the power-supply pin of the bus switch chip;

wherein the mid voltage from the mid-level supply is applied to the ground pin of the bus switch chip;

wherein the differential signals generated by the first differential transmitter swing within a voltage range that is between the mid voltage and the power supply voltage; and a plurality of pull-ups, coupled between the power supply voltage and the first bus, for driving the differential signals from the first differential transmitter above the mid voltage when the first differential transmitter is disabled, whereby the bus switch chip is supply-level shifted to pass the differential signals at the voltage range above the mid voltage applied to the ground pin of the bus switch chip.

2. The differential signaling system of claim 1 wherein the first differential transmitter and the differential receiver are powered by the power supply and the ground supply.

3. The differential signaling system of claim 2 wherein the first differential transmitter and the differential receiver are not powered by the mid-level supply;

wherein the bus switch chip is not connected to the ground voltage from the ground supply.

4. The differential signaling system of claim 3 wherein the bus switch chip is subject to damage when a difference between voltages applied to the power-supply pin and the ground pin exceed a specified voltage;

wherein the specified voltage is below the power supply voltage from the power supply, whereby the bus switch chip has a limited power supply voltage.

5. The differential signaling system of claim 4 wherein each channel in the plurality of channels on the bus switch chip comprises:

an n-channel transistor having a gate responsive to the control signal, a first source/drain coupled to a differential signal line from the first differential transmitter, and a second source/drain coupled to a differential signal line to the differential receiver, whereby a plurality of n-channel transistors connect the first bus to the second bus when the control signal is in the connect state, and isolate the first bus from the second bus when the control signal is in the isolate state.

6. The differential signaling system of claim 5 wherein the plurality of pull-ups comprises for each channel in the plurality of channels on the bus switch chip:

a p-channel pullup transistor having a gate responsive to the control signal, a source connected to the power-supply pin, and a drain connected to the first source/drain of the n-channel transistor;

whereby the first bus is actively driven higher by a plurality of the p-channel pullup transistors when the control signal is in the isolate state.

7. The differential signaling system of claim 1 wherein the plurality of pull-ups comprises:

a plurality of pullup resistors coupled between the power supply voltage and the first bus, the plurality of pullup resistors being external to the bus switch chip.

8. The differential signaling system of claim 1 wherein the first differential transmitter is a non-compliant transmitter that does not comply with a standard for the differential signals because the first differential transmitter drives the differential signals to the ground voltage when disabled, in violation of the standard, whereby the differential signals are illegally driven to ground.

9. The differential signaling system of claim 8 wherein the standard is Digital Visual Interface (DVI) that uses Transmission-minimized differential signaling (TMDS).

10. The differential signaling system of claim 8 wherein the standard is High-Definition Multimedia Interface (HDMI).

11. The differential signaling system of claim 1 wherein the power supply voltage is above 3 volts and the mid voltage is within 0.3 volts of 1.5 volts.

12. The differential signaling system of claim 11 wherein the voltage range of the differential signals is nominally 2.7 to 3.3 volts.

13. The differential signaling system of claim 1 further comprising:

a second differential transmitter that generates differential signals applied to the bus switch chip as a third bus;

wherein the bus switch chip a bus switch chip further comprises a second plurality of channels that connect the third bus to the second bus in response to the control signal being in the isolate state, and that isolate the third bus from the second bus in response to the control signal being in the connect state;

wherein the second plurality of channels comprise n-channel transistors that have gates driven by an inverse signal generated from the control signal.

14. The differential signaling system of claim 13 wherein the bus switch chip further comprises:

a first diode and a first series resistor in series between a pin for the first bus and the power-supply pin;

a second diode and a second series resistor in series between a pin for the second bus and the ground pin;

wherein the first and second diodes and first and second series resistors provide protection from electro-static-discharges (ESD).

15. A supply-level-shifted bus switch comprising:

a bus switch chip mounted to a circuit board;

a ground line on the circuit board for carrying a ground voltage;

a power-supply line on the circuit board for carrying a power-supply voltage;

a mid-supply line on the circuit board for carrying a mid voltage that is between the power-supply voltage and the ground voltage;

wherein the bus switch chip has a power connection to the power-supply line and a ground connection to the mid-supply line, the bus switch chip not being connected to the ground line on the circuit board;

the bus switch chip comprising:

a control input for receiving a control signal from the circuit board;

a plurality of first inputs for a first bus that carries differential signals that are paired together with a true signal that is driven to a high voltage and a complement signal that is driven to a low voltage for a logical high, wherein the true signal that is driven to the low voltage and the complement signal is driven to the high voltage for a logical low;

a plurality of outputs for a second bus that carries differential signals that are paired together; and a plurality of bus-switch transistors that have conducting channels that connect the plurality of first inputs to the plurality of outputs, the conducting channels being controlled by gates that are controlled by the control signal or a derivative of the control signal;

whereby the bus switch chip is supply-level shifted.

16. The supply-level-shifted bus switch of claim 15 further comprising:

a plurality of external pull-up resistors, coupled between the plurality of inputs and the power-supply line, for raising voltages of the plurality of inputs above the mid voltage when the plurality of inputs are driven to the ground voltage, whereby the bus switch chip is protected from inputs below the mid voltage.

17. The supply-level-shifted bus switch of claim 15 wherein the bus switch chip further comprises:

a plurality of pullup transistors having conducting channels that connect the plurality of first inputs to the power-supply voltage on the power-supply line, the conducting channels being controlled by gates that are controlled by the control signal or a derivative of the control signal;

wherein the plurality of pullup transistors isolate and do not connect when the plurality of bus-switch transistors connect the plurality of first inputs to the plurality of outputs;

wherein the plurality of pullup transistors connect when the plurality of bus-switch transistor isolate and do not connect the plurality of first inputs to the plurality of outputs.

18. The supply-level-shifted bus switch of claim 17 wherein the plurality of bus-switch transistors are n-channel transistors;

wherein the plurality of pullup transistors are p-channel transistors.

19. The supply-level-shifted bus switch of claim 18 wherein the power-supply voltage is within 0.3 volt of 3.3 volts, the mid voltage is within 0.3 volt of 1.5 volts, and the ground voltage is 0 volts;

wherein the differential signals swing between 2.7 and 3.3 volts during switching.

20. A level-shifting differential-signaling system comprising:

bus switch means for connecting a first bus to a second bus in response to a control signal being in a connect state, and for isolating the first bus from the second bus in response to the control signal being in an isolate state;

power-supply pin means for powering the bus switch means from an external power source;

ground pin means for powering the bus switch means from an external supply;

differential transmitter means for generating differential signals applied to the bus switch means as the first bus;

differential receiver means, coupled to the second bus from the bus switch means, for receiver receiving differential signals passed through the bus switch means from the differential transmitter means when the control signal is in the connect state;

ground supply means for carrying a ground voltage;

power supply means for carrying a power supply voltage above the ground voltage;

mid-level supply means for carrying a mid voltage between the power supply voltage and the ground voltage;

wherein the power supply voltage from the power supply means is applied to the power-supply pin means of the bus switch means;

wherein the mid voltage from the mid-level supply means is applied to the ground pin means of the bus switch means;

wherein the differential signals generated by the differential transmitter means swing within a voltage range that is between the mid voltage and the power supply voltage; and a plurality of pull-ups, coupled between the power supply voltage and the first bus, for driving the differential signals from the differential transmitter means above the mid voltage when the differential transmitter means is disabled, whereby the bus switch means is supply-level shifted to pass the differential signals at the voltage range above the mid voltage applied to the ground pin means of the bus switch means.

21. The level-shifting differential-signaling system of claim 20 wherein the bus switch means comprises a plurality of transistor means for connecting differential signals on the first bus to corresponding differential signals on the second bus in response to gates driven by the control signal or a derivative of the control signal;

wherein the differential transmitter means and the differential receiver means are powered by the power supply means and the ground supply means;

further comprising:

voltage divider means for level shifting the control signal to a low voltage of at least the mid voltage and a high voltage of the power supply voltage.

* * * * *